(12) United States Patent
Winterburn et al.

(10) Patent No.: US 12,250,025 B2
(45) Date of Patent: Mar. 11, 2025

(54) ELECTROMAGNETIC FIELD RECEIVER

(71) Applicant: BRITISH TELECOMMUNICATIONS PUBLIC LIMITED COMPANY, London (GB)

(72) Inventors: Amelia Winterburn, London (GB); Marco Menchetti, London (GB)

(73) Assignee: BRITISH TELECOMMUNICATIONS PUBLIC LIMITED COMPANY (GB)

( * ) Notice: Subject to any disclaimer, the term of this patent is extended or adjusted under 35 U.S.C. 154(b) by 0 days.

(21) Appl. No.: 18/554,529

(22) PCT Filed: Mar. 4, 2022

(86) PCT No.: PCT/EP2022/055578
§ 371 (c)(1),
(2) Date: Oct. 9, 2023

(87) PCT Pub. No.: WO2022/214251
PCT Pub. Date: Oct. 13, 2022

(65) Prior Publication Data
US 2024/0089008 A1 Mar. 14, 2024

(30) Foreign Application Priority Data
Apr. 9, 2021 (GB) ..................................... 2105101

(51) Int. Cl.
*H04B 10/60* (2013.01)
*G01R 29/08* (2006.01)
*H04B 10/00* (2013.01)

(52) U.S. Cl.
CPC ............. *H04B 10/60* (2013.01); *G01R 29/08* (2013.01); *H04B 10/00* (2013.01); *H04B 2210/006* (2013.01)

(58) Field of Classification Search
CPC ... H04B 10/60; H04B 2210/006; G01R 29/08
See application file for complete search history.

(56) References Cited

U.S. PATENT DOCUMENTS 9,970,973 B2    5/2018  Anderson et al.
10,763,966 B1   9/2020  Deb et al.
(Continued)

FOREIGN PATENT DOCUMENTS

CN    103616568 A    3/2014
CN    105068025 A    11/2015
(Continued)

OTHER PUBLICATIONS

"International Preliminary Report on Patentability received for PCT Patent Application No. PCT/EP2022/055578, mailed on Aug. 23, 2023", pp. 1-8.
(Continued)

*Primary Examiner* — Leslie C Pascal
(74) *Attorney, Agent, or Firm* — EIP US LLP

(57) ABSTRACT

This disclosure provides a method of receiving a plurality of data streams at an electromagnetic field receiver in a wireless telecommunications network, the method including obtaining data indicating detection of a first electromagnetic field incident at a transmission medium during a timeslot of a first subset of a plurality of timeslots; associating the detected first electromagnetic field with a first data stream of a plurality of data streams; obtaining data indicating detection of a second electromagnetic field incident at the transmission medium during a timeslot of a second subset of the plurality of timeslots; and associating the detected second electromagnetic field with a second data stream of the plurality of data streams.

15 Claims, 6 Drawing Sheets

(56) References Cited

U.S. PATENT DOCUMENTS

| | | |
|---|---|---|
| 2009/0289629 A1 | 11/2009 | Tuchman |
| 2016/0363617 A1 | 12/2016 | Anderson et al. |
| 2020/0136727 A1 | 4/2020 | Graceffo et al. |
| 2020/0295838 A1 | 9/2020 | Gordon et al. |

FOREIGN PATENT DOCUMENTS

| | | |
|---|---|---|
| CN | 106802373 A | 6/2017 |
| CN | 108604038 A | 9/2018 |
| CN | 109001137 A | 12/2018 |
| CN | 110401492 A | 11/2019 |
| CN | 112415284 A | 2/2021 |
| GB | 2597260 A | 1/2022 |
| WO | 2021078438 A1 | 4/2021 |
| WO | 2022214252 A1 | 10/2022 |

OTHER PUBLICATIONS

"International Search Report and Written Opinion received for PCT Patent Application No. PCT/EP2022/055578, mailed on Jul. 19, 2022", pp. 1-22.

"International Search Report and Written Opinion received for PCT Patent Application No. PCT/EP2022/055580, mailed on Jun. 24, 2022", pp. 1-10.

"Office Action received for Great Britain Patent Application No. 2105101.6, mailed on Aug. 1, 2022", pp. 1-6.

"Office Action received for Great Britain Patent Application No. 2105101.6, mailed on Jan. 10, 2022", pp. 1-13.

Anderson, et al., "Rydberg Atoms for Radio-Frequency Communications and Sensing: Atomic Receivers for Pulsed RF Field and Phase Detection", Cornell University Library, Available Online at <https://arxiv.org/abs/1910.07970v1, Oct. 18, 2019, pp. 1-10.

Holloway, et al., "Detecting and Receiving Phase-Modulated Signals With a Rydberg Atom-Based Receiver", IEEE Antennas and Wireless Propagation Letters, vol. 18, No. 9, Sep. 9, 2019, pp. 1853-1857.

Holloway, et al., "Electric Field Metrology For Si Traceability: Systematic Measurement Uncertainties In Electromagnetically Induced Transparency In Atomic Vapor", Journal of Applied Physics, vol. 121, 233106, 2017, pp. 1-9.

Kumar, et al., "Atom-Based Sensing of Weak Radio Frequency Electric Fields Using Homodyne Readout", Scientific Reports, vol. 7, No. 1, Available Online at <https://www.nature.com/articles/srep42981.pdf>, Feb. 20, 2017, 10 pages.

Li, et al., "Transient Properties of an Electromagnetically Induced Transparency in Three-level Atoms", Optics Letters, vol. 20, No. 13, Jul. 1, 1995, pp. 1489-1491.

Meyer, et al., "Digital Communication with Rydberg Atoms & Amplitude-Modulated Microwave Fields", Cornell University Library, Available Online at <https://aps.arxiv.org/abs/1803.03545v2>, Oct. 29, 2018, pp. 1-10.

Otto, et al., "Bandwidth Increase Through Distributed Atomic Receivers in a Rydberg Vapour Cell", Cornell University Library, Available online at <https://aps.arxiv.org/abs/2102.05285v1>, Dec. 5, 2021, pp. 1-9.

Robinson, et al., "Determining the Angle-of-Arrival of an Radio-Frequency Source with a Rydberg Atom-Based Sensor", Cornell University Library, Available Online at <https://arxiv.org/abs/2101.12071>, Jan. 29, 2021, pp. 1-5.

Song, et al., "The Credibility of Rydberg Atom Based Digital Communication Over a Continuously Tunable Radio-Frequency Carrier", Cornell University Library, Available Online at <https://arxiv.org/abs/1808.10839>, Sep. 5, 2018, pp. 1-5.

Souza, et al., "EIT-Related Phenomena and Their Mechanical Analogs", Cornell University Library, Available Online at <https://arxiv.org/abs/1408.1024v4>, Jul. 14, 2015, pp. 1-20.

Zou, et al., "Atomic Receiver by Utilizing Multiple Radio-Frequency Coupling at Rydberg States of Rubidium", Applied Sciences, vol. 10, No. 4, 2020, pp. 1-8.

"Chinese Office Action for Application for No. 202280026871.3, dated Feb. 5, 2024", 7 pgs.

"Chinese Office Action issued in 202280027185.8, dated Mar. 5, 2024".

Yang, et al., "Electromagnetically induced transparency of Rydberg atoms in modulated laser fields", Acta Physica Sinica, vol. 65, No. 10 (Abstract Only), 2016, 7 pgs.

Lan, "A Multiplexed Quantum Memory", Optics Express, vol. 17, No. 16, Aug. 3, 2009, pp. 13639-13645.

Lvovsky, "Optical Quantum Memory", Available at: arXiv:1002.4659v3, Apr. 16, 2010, pp. 1-15.

Zhang, "Realization of a Programmable Multipurpose Photonic Quantum Memory with Over-Thousand Qubit Manipulations", Physical Reviews, vol. 14, Apr. 25, 2024, pp. 021018-1-021018-18.

ELECTROMAGNETIC FIELD RECEIVER

PRIORITY CLAIM

The present application is a National Phase entry of PCT Application No. PCT/EP2022/055578, filed Mar. 4, 2022, which claims priority from GB Patent Application No. 2105101.6, filed Apr. 9, 2021, each of which is hereby fully incorporated herein by reference.

TECHNICAL FIELD

The present disclosure relates to an electromagnetic field receiver. In particular, this disclosure relates to a Radio Frequency (RF) receiver.

BACKGROUND

Conventional RF detectors, such as a dipole antenna, utilize metallic conductors in which electrons move along the conductor in response to an incident RF electric field to produce a small current. In addition to merely detecting the RF signal, an RF receiver may be created by converting this current (e.g. utilizing electronic circuits, mixers, amplifiers and digitizers) into a demodulated, amplified signal.

In many applications it is desirable to reduce the size of the RF receiver. However, conventional RF receivers based on metallic conductors are limited in size as the relationship between sensitivity, frequency and conductor length means that the RF receiver will not perform adequately below a certain size for a given application. An electrically small antenna is one that is operated at a frequency below its natural resonance, but these are limited by the Chu limit that will set the minimum size for any antenna used at a given frequency. A further limitation for conventional RF receivers is that the ability to sense weak RF signals is dependent on the receiver's gain, which is determined by the design of the antenna. Accordingly, the performance of a conventional antenna is restricted in size, bandwidth and sensitivity.

A new form of RF receiver is based on a Rydberg atom. A Rydberg atom is an atom with one or more electrons excited to a very high principal quantum number. These Rydberg atoms have several useful properties, such as very large dipole moments and long decay periods. These properties can be exploited to create an RF receiver that may receive and demodulate Amplitude-Modulated (AM), Frequency-Modulated (FM) and Phase Modulated (PM) RF electric fields over very large frequency ranges (e.g. from hundreds of MHz to 1 THz).

An example Rydberg-atom based RF receiver is shown in FIG. 1 and operates as follows. An atomic medium is provided which, in this example, is a glass cell filled with a low density vapor of alkali atoms (such as Rubidium-85). Each Rubidium-85 atom has a number of electron states, including the ground state ($|1\rangle$) and a plurality of excited states. The outer electron of the Rubidium-85 atom may be excited (e.g. by absorbing a photon of a particular wavelength) from the ground state ($|1\rangle$) to an excited state. The electron may then decay from the excited state to a lower excited state (that is, an excited state at a lower energy level) or to the ground state ($|1\rangle$). However, some of these transitions are not allowed as they are dipole forbidden.

In the RF receiver, a first laser (known as a "probe" laser) is passed through the atomic medium at a first wavelength which corresponds to the energy required to elevate the Rubidium-85 atom's outer electron from its ground state ($|1\rangle$) to a first excited state ($|2\rangle$). A second laser (known as a "coupling" laser) is also passed through the atomic medium in an opposing direction at a relatively large power level (compared to the probe laser) and at a second wavelength which corresponds to the energy required to elevate the Rubidium-85 atom's outer electron from the first excited state ($|2\rangle$) to a Rydberg state ($|3\rangle$). The transition from the Rydberg state ($|3\rangle$) to the ground state ($|1\rangle$) is forbidden so that the ground state ($|1\rangle$) becomes depopulated and so fewer atoms can absorb the probe laser operating at the first wavelength. Accordingly, the atomic medium becomes more transparent to the probe laser such that there is an increase in transmission of the probe laser, which is observable at an optical detector. This phenomenon is known as Electromagnetically Induced Transparency (EIT) and the received signal is known as the EIT signal. Specifically, the above description is of a ladder scheme EIT effect, but the skilled person would understand that the EIT effect may be realized through alternative electron transitions, such as the Vee and Lambda schemes.

Once the atomic medium has become transparent to the probe laser, then a further physical effect can be exploited to detect RF electric fields. As the Rubidium-85 atom's outer electron is much further away from the atomic nucleus when in the Rydberg state compared to the ground state, a large dipole moment is created and it becomes responsive to incident RF electric fields. An incident RF electric field may cause a further transition of an electron from the Rydberg state to an adjacent Rydberg state. If the transition from the adjacent Rydberg state to the ground state is not forbidden, then electrons may subsequently drop to the ground state so that the atomic medium becomes less transparent to the probe laser, causing a drop in amplitude of the EIT signal. This drop in amplitude of the EIT signal is directly proportional to the incident RF electric field's amplitude, thus creating a Rydberg-atom based AM RF receiver. Rydberg-atom based RF receivers have also been shown to detect frequency modulated and phase modulated RF fields. Regardless of the modulation scheme used, the Rydberg atom based RF detector may be configured to detect RF fields of a specific frequency by selecting a particular second wavelength of the coupling laser so that the electrons of the atomic medium are elevated to a particular Rydberg state. This Rydberg state is selected so that photons at the specific frequency to be detected will elevate electrons from this Rydberg state to its adjacent Rydberg state, creating a detectable change in the EIT signal that may be observed at the optical detector.

SUMMARY

According to a first aspect of the disclosure, there is provided a method of receiving a plurality of data streams at an electromagnetic field receiver in a wireless telecommunications network, wherein the electromagnetic field receiver comprises a first optical transmitter, a second optical transmitter, a transmission medium and an optical receiver, wherein the first optical transmitter is configured to transmit a first probe signal to the optical receiver through the first transmission medium at a first probe frequency and the second optical transmitter is configured to transmit a first coupling signal through the transmission medium at a first coupling frequency, wherein the first probe frequency and first coupling frequency are set to excite electrons of the transmission medium to a predetermined excited state so as to induce an Electromagnetic Induced Transparency, EIT, effect in the transmission medium such that an incident electromagnetic field at a first frequency at the transmission medium causes a detectable change in the first probe signal at the optical receiver, wherein the plurality of data streams are time multiplexed in a first time frame comprising a plurality of timeslots, such that the first data stream is communicated in a first subset of the plurality of timeslots of the first time frame and the second data stream is communicated in a second subset of the plurality of timeslots of the first time frame, the method comprising: obtaining data indicating detection of a first electromagnetic field incident at the transmission medium during a timeslot of the first subset of the plurality of timeslots; associating the detected first electromagnetic field with a first data stream of the plurality of data streams; obtaining data indicating detection of a second electromagnetic field incident at the transmission medium during a timeslot of the second subset of the plurality of timeslots; and associating the detected second electromagnetic field with a second data stream of the plurality of data streams.

The first optical transmitter may be configured to transmit a first probe signal to the optical receiver through the transmission medium at a first probe frequency and the second optical transmitter may be configured to transmit a first coupling signal through the transmission medium at a first coupling frequency, wherein the first probe frequency and first coupling frequency may be set to excite electrons of the transmission medium to a first predetermined excited state so as to induce an EIT effect in the transmission medium such that an electromagnetic field at a first frequency incident at the transmission medium causes a detectable change in the first probe signal at the optical receiver, and wherein the first optical transmitter may be configured to transmit a second probe signal to the optical receiver through the transmission medium at a second probe frequency and the second optical transmitter may be configured to transmit a second coupling signal through the transmission medium at a second coupling frequency, wherein the second probe frequency and second coupling frequency may be set to excite electrons of the transmission medium to a second predetermined excited state so as to induce an EIT effect in the transmission medium such that an electromagnetic field at a second frequency incident at the transmission medium causes a detectable change in the second probe signal at the optical receiver, wherein detection of the first electromagnetic field may be in the first probe signal and detection of the second electromagnetic field may be in the second probe signal.

The electromagnetic field receiver may include a first transmission medium and a second transmission medium, the first and second transmission media may be spatially distinct, wherein the first probe signal and first coupling signal may be transmitted through the first transmission medium and the second probe signal and second coupling signal may be transmitted through the second transmission medium.

The first probe signal and first coupling signal may be transmitted through the first and second transmission media in a first condition and a second condition, in which: in the first condition of each transmission medium, the probe and coupling signals are transmitted within that transmission medium, the second condition of each transmission medium exists for a time period for which an effect of the coupling signal on the electrons of the transmission medium persists after a switch from the first condition to the second condition, and, an intensity of the coupling signal is such that: $\Omega_c^2 < \Gamma_1 \Gamma_2$ in which $\Omega_c$ is a Rabi frequency of the coupling signal, $\Gamma_1$ is the transition rate out of the first excited state of the transmission medium, and $\Gamma_2$ is the transition rate out of the predetermined excited state of the transmission medium.

The plurality of data streams may also be time multiplexed in second time frame comprising a plurality of timeslots, such that a third data stream may be communicated in a first subset of the plurality of timeslots of the second time frame and a fourth data stream may be communicated in a second subset of the plurality of timeslots of the second time frame, and the method may further comprise: obtaining data indicating detection of a third electromagnetic field incident at the transmission medium during a timeslot of the first subset of the plurality of timeslots of the second time frame; associating the detected third electromagnetic field with the third data stream of the plurality of data streams; obtaining data indicating detection of a fourth electromagnetic field incident at the transmission medium during a timeslot of the second subset of the plurality of timeslots of the second time frame; and associating the detected fourth electromagnetic field with the fourth data stream of the plurality of data streams.

The electromagnetic field receiver may include a first transmission medium and a second transmission medium, the first and second transmission media may be spatially distinct, wherein the first probe signal and first coupling signal may be transmitted through the first transmission medium and the second probe signal and second coupling signal may be transmitted through the second transmission medium, wherein the first predetermined excited state and second predetermined excited state may be different.

The first predetermined excited state and second predetermined excited state may be the same or different.

According to a second aspect of the disclosure, there is provided a method of receiving a plurality of data streams at an electromagnetic field receiver in a wireless telecommunications network, wherein the electromagnetic field receiver comprises a first optical transmitter, a second optical transmitter, a first transmission medium, a second transmission medium, and an optical receiver, the first and second transmission media being spatially distinct, wherein the first optical transmitter is configured to transmit a first probe signal to the optical receiver through the first transmission medium at a first probe frequency and is further configured to transmit a second probe signal to the optical receiver through the second transmission medium at a second probe frequency, the second optical transmitter is configured to transmit a first coupling signal through the first transmission medium at a first coupling frequency and is further configured to transmit a second coupling signal through the second transmission medium at a second coupling frequency, the first probe frequency and first coupling frequency are set to excite electrons of the first transmission medium to a first predetermined excited state so as to induce an Electromagnetically Inducted Transparency, EIT, effect in the first transmission medium such that an electromagnetic field at a first frequency incident at the first transmission medium causes a detectable change in the first probe signal at the optical receiver, and the second probe frequency and second coupling frequency are set to excite electrons of the second transmission medium to a second predetermined excited state, different to the first predetermined excited state, so as to induce an EIT effect in the second transmission medium such that an electromagnetic field at a second frequency incident at the second transmission medium causes a detectable change in the second probe signal at the optical receiver, the method comprising: obtaining data indicating detection, in the first probe signal, of a first electromagnetic field incident at the first transmission medium; associating the detected first electromagnetic field with a first data stream of the plurality of data streams; obtaining data indicating detection, in the second probe signal, of a second electromagnetic field incident at the second transmission medium; and associating the detected second electromagnetic field with a second data stream of the plurality of data streams.

According to a third aspect of the disclosure, there is provided a computer program comprising instructions which, when the program is executed by a computer, cause the computer to carry out the first aspect of the disclosure. The computer program may be stored on a computer readable carrier medium.

According to a fourth aspect of the disclosure, there is provided a device for processing a plurality of data streams received at an electromagnetic field receiver in a wireless telecommunications network, the electromagnetic field receiver including a transmission medium, an optical receiver, a first optical transmitter configured to transmit a first probe signal to the optical receiver through the transmission medium at a first probe frequency, and a second optical transmitter configured to transmit a first coupling signal through the transmission medium at a first coupling frequency, wherein the first probe frequency and first coupling frequency are set to excite electrons of the transmission medium to a predetermined excited state so as to induce an Electromagnetic Induced Transparency, EIT, effect in the transmission medium such that an incident electromagnetic field at a first frequency at the transmission medium causes a detectable change in the first probe signal at the optical receiver, wherein the plurality of data streams are time multiplexed in a first time frame comprising a plurality of timeslots, such that the first data stream is communicated in a first subset of the plurality of timeslots of the first time frame and the second data stream is communicated in a second subset of the plurality of timeslots of the first time frame, the device comprising a processor configured to: obtain data indicating detection, in the probe signal, of a first electromagnetic field incident at the transmission medium during a timeslot of the first subset of the plurality of timeslots, associate the detected first electromagnetic field with a first data stream of the plurality of data streams, obtain data indicating detection, in the probe signal, of a second electromagnetic field incident at the transmission medium during a timeslot of the second subset of the plurality of timeslots, and associate the detected second electromagnetic field with a second data stream of the plurality of data streams.

According to a fifth aspect of the disclosure, there is provided a device for processing a plurality of data streams received at an electromagnetic field receiver in a wireless telecommunications network, the electromagnetic field receiver including a first transmission medium, a second transmission medium being spatially distinct to the first transmission medium, an optical receiver, a first optical transmitter configured to transmit a first probe signal to the optical receiver through the first transmission medium at a first probe frequency and further configured to transmit a second probe signal to the optical receiver through the second transmission medium at a second probe frequency, and a second optical transmitter configured to transmit a first coupling signal through the first transmission medium at a first coupling frequency and further configured to transmit a second coupling signal through the second transmission medium at a second coupling frequency, wherein the first probe frequency and first coupling frequency are set to excite electrons of the first transmission medium to a first predetermined excited state so as to induce an Electromagnetically Inducted Transparency, EIT, effect in the first transmission medium such that an electromagnetic field at a first frequency incident at the first transmission medium causes a detectable change in the first probe signal at the optical receiver, and the second probe frequency and second coupling frequency are set to excite electrons of the second transmission medium to a second predetermined excited state, different to the first predetermined excited state, so as to induce an EIT effect in the second transmission medium such that an electromagnetic field at a second frequency incident at the second transmission medium causes a detectable change in the second probe signal at the optical receiver, the device comprising a processor configured to: obtain data indicating detection, in the first probe signal, of a first electromagnetic field incident at the first transmission medium, associate the detected first electromagnetic field with a first data stream of the plurality of data streams, obtain data indicating detection, in the second probe signal, of a second electromagnetic field incident at the second transmission medium, and associate the detected second electromagnetic field with a second data stream of the plurality of data streams.

BRIEF DESCRIPTION OF THE FIGURES

In order that the present disclosure may be better understood, embodiments thereof will now be described, by way of example only, with reference to the accompanying drawings in which.

DETAILED DESCRIPTION OF EMBODIMENTS

Figure 1:
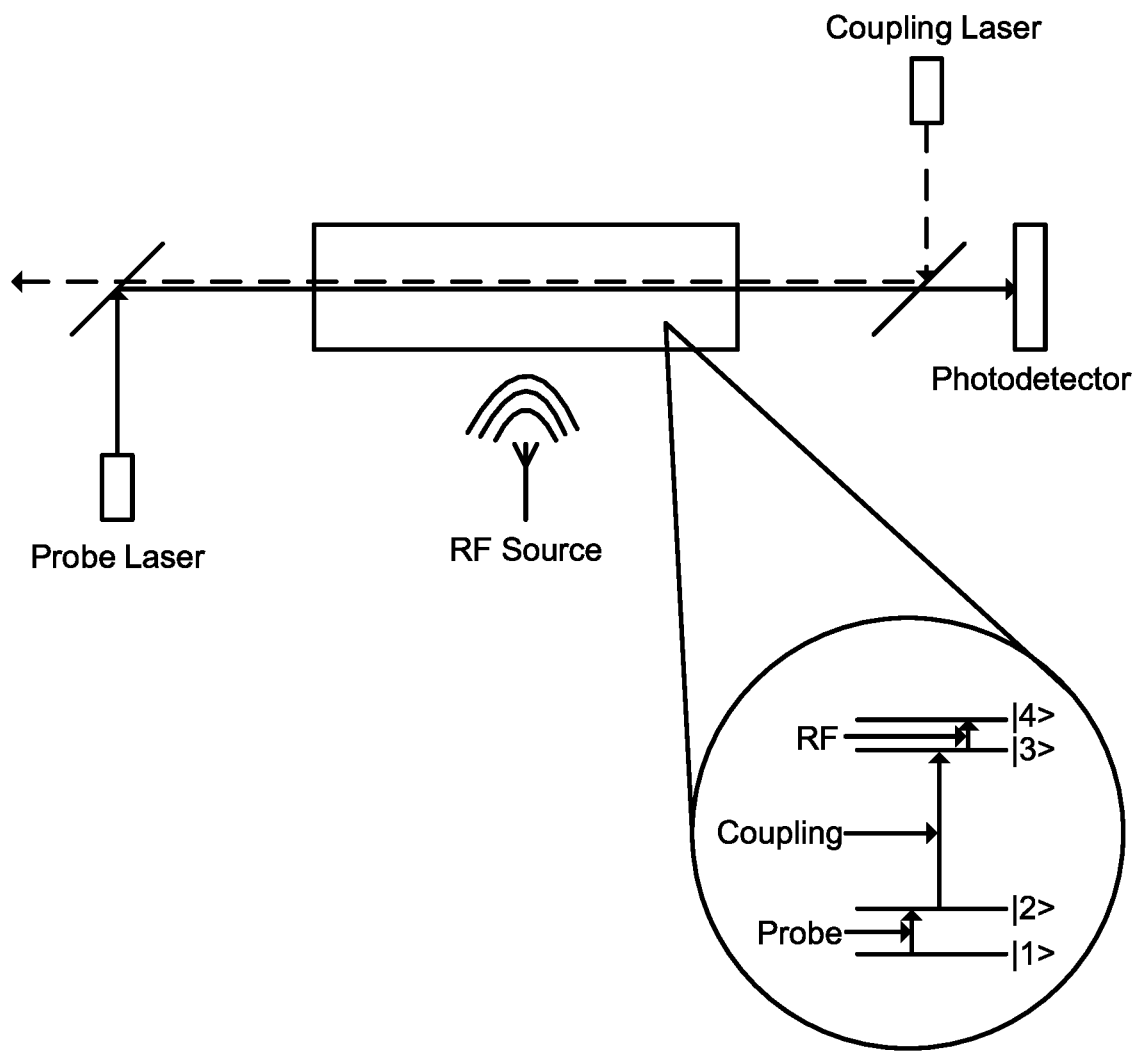
FIG. 1 is a schematic diagram of conventional Rydberg-atom based Radio-Frequency (RF) receiver.
Figure 2:
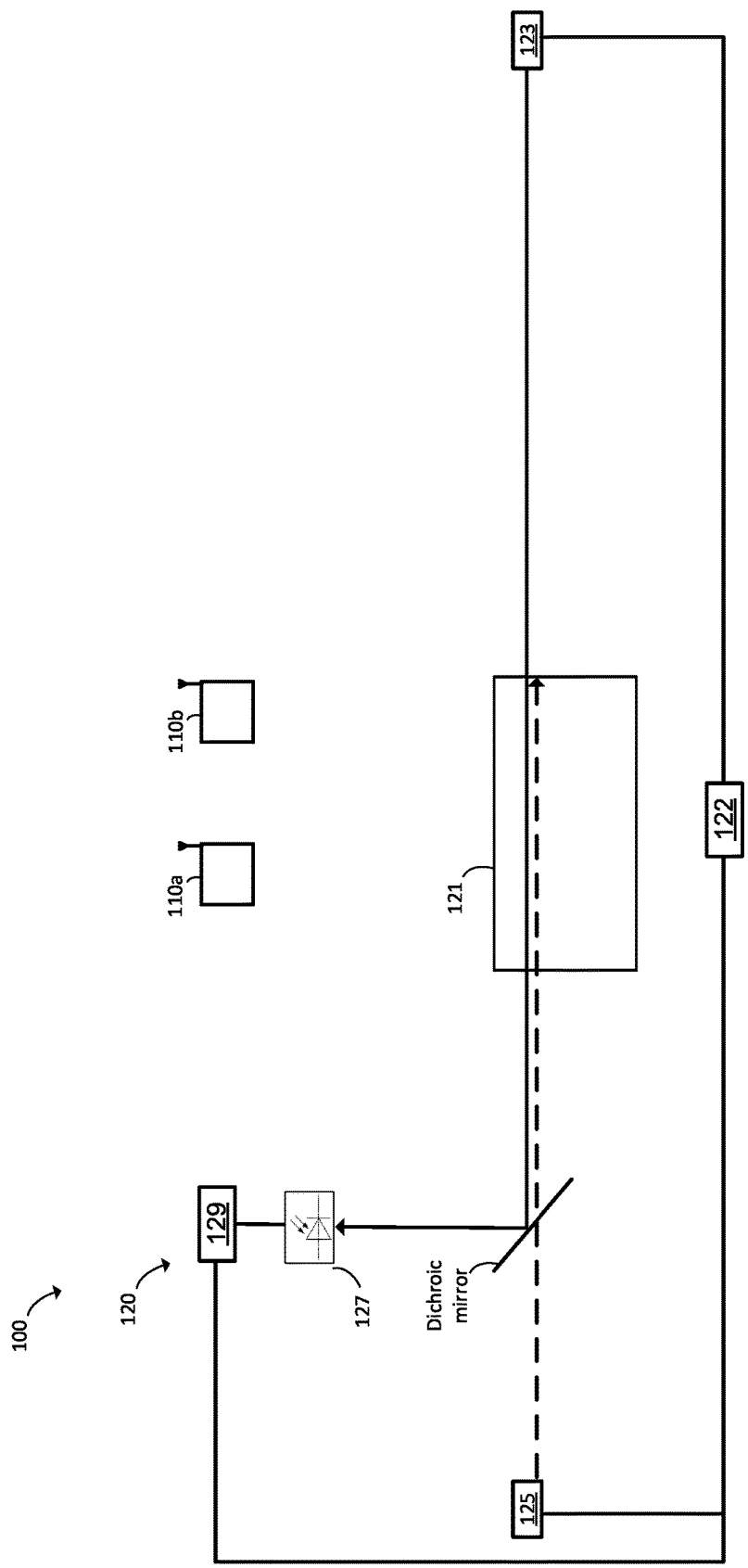
FIG. 2 is a schematic diagram of a first embodiment of a wireless telecommunications network of the present disclosure.

A first embodiment of a wireless telecommunications network 100 of the present disclosure will now be described. As shown in FIG. 2, the wireless telecommunications network 100 includes a first wireless transmitter 110*a*, a second wireless transmitter 110*b*, and a Radio-Frequency (RF) receiver 120. In this embodiment, the first wireless transmitter 110*a* is configured to transmit wireless signals at a frequency of 2.8 GHz and the second wireless transmitter 110*b* is configured to transmit wireless signals at a frequency of 5 GHz. The RF receiver 120 is a Rydberg-atom based RF receiver and includes a vapor cell 121, a probe laser 123, a coupling laser 125 and a photodetector 127. The RF receiver 120 also includes a processor 129 for processing the received signal data of the photodetector 127. The vapor cell 121 contains a vapor of alkali metal (in this embodiment, Rubidium-85).

The RF receiver 120 may be configured so as to detect a wireless signal incident upon the vapor cell 120. This is achieved by configuring the probe laser 123 of the RF receiver 120 to transmit a probe signal (illustrated by the solid arrowed line) through the vapor cell 121, thus exciting electrons of the Rubidium-85 atoms of the vapor cell 121, and by configuring the coupling laser 125 of the RF receiver 120 to transmit a coupling signal (illustrated by the dashed arrowed line) through the vapor cell 121 (counter-propagating and overlapping the probe laser 123), thus also exciting electrons of the Rubidium-85 atoms in the vapor cell 121. The frequency of the probe signal is set to correlate with the transition of an electron of a Rubidium-85 atom from a ground state to a first excited state, and the frequency of the coupling signal is set to correlate with the transition of an electron of a Rubidium-85 atom from the first excited state to a predetermined Rydberg state. The predetermined Rydberg state is selected (based on the specific frequencies of the probe and coupling signals) so that a wireless signal incident upon the vapor cell 121 excites electrons from the predetermined Rydberg state to an adjacent Rydberg state, causing a detectable change in the Electromagnetically Induced Transparency (EIT) signal at the photodetector 127.

In this embodiment, the RF receiver 120 is configurable so as to detect wireless signals in a time-division multiplexing technique. This is achieved by the RF receiver 120 switching between a first configuration in which it is configured to detect a wireless signal of a first frequency in a first timeslot and a second configuration in which it is configured to detect a wireless signal of a second frequency in a second timeslot. In this example, the first configuration is for detecting wireless signals at a frequency of 2.8 GHz and the second configuration is for detecting wireless signals at a frequency of 5 GHz. Therefore, in the first configuration, the probe signal and coupling signals are selected so as to excite electrons to a first predetermined Rydberg state having the $90^{th}$ principal quantum number energy state (i.e. the probe signal has a wavelength of 780 nm and the coupling signal has a wavelength of 479.380 nm). In this first configuration, wireless signals transmitted by the first wireless transmitter 110a at 2.8 GHz that pass through the vapor cell 121 will excite electrons from this first predetermined Rydberg state to another Rydberg state, causing an EIT signal in the monitored probe signal at the photodetector 127. Furthermore, in the second configuration, the probe signal and coupling signals are selected so as to excite electrons to a second predetermined Rydberg state having the $74^{th}$ principal quantum number energy state (i.e. the probe signal has a wavelength of 780 nm and the coupling signal has a wavelength of 479.537 nm). In this second configuration, wireless signals transmitted by the second wireless transmitter 110b at 5 GHz that pass through the vapor cell 121 will excite electrons from this second predetermined Rydberg state to another Rydberg state, causing an EIT signal in the monitored probe signal at the photodetector 127.

The RF receiver 120 also has a controller 122 for controlling a frequency of the probe signal (i.e. to adjust and/or stabilize the frequency of the probe signal), for controlling a frequency of the coupling signal (i.e. to adjust and/or stabilize the frequency of the coupling signal), for controlling an intensity of the probe laser 123 (i.e. the transmission power and/or cross-sectional area of the probe laser 123), for controlling an intensity of the coupling laser 125 (i.e. the transmission power and/or cross-sectional area of the coupling laser 125), and for time synchronizing the photodetector 127 and at least one of the probe laser 123 and coupling laser 125 (explained in more detail below).

In this embodiment, the network 100 is configured for communication according to a time frame structure in which the time frame is divided into a plurality of timeslots, wherein a first subset of the plurality of timeslots are for communication of wireless signals at 2.8 GHz and a second subset of the plurality of timeslots are for communication of wireless signals at 5 GHz. The first wireless transmitter 110a, second wireless transmitter 110b, and RF detector 120 are therefore time synchronized (or at least frame synchronized) so that the start of a time frame in each entity is at a common time. This synchronization may be achieved by use of a Global Navigation Satellite System (GNSS) module, such as a Global Positioning System (GPS) module, or by an initial configuration process comprising sharing of synchronization signals (as is common in cellular telecommunications protocols).

Furthermore, in this embodiment in which the RF receiver 120 is configured to demultiplex a plurality of time-multiplexed data streams, then the first subset of the plurality of timeslots are designated for communication of a first data stream (between the first wireless transmitter 110a and RF receiver 120) and the second subset of the plurality of timeslots are designated for communication of a second data stream (between the second wireless transmitter 110b and RF receiver 120).

Accordingly, in each timeslot of the first subset of timeslots:
   the first wireless transmitter 110a is configured to transmit its first data stream in wireless signals transmitted at 2.8 GHz;
   controller 122 configures the probe laser 123 and/or coupling laser 125 so as to excite electrons to the first predetermined Rydberg state so that RF detector 120 is configured to detect these wireless signals at 2.8 GHz; and
   controller 122 configures the processor 129 so that the wireless signals received at the photodetector 127 are demultiplexed into a first data stream.

Furthermore, for each timeslot of the second set of timeslots:
   the second wireless transmitter 110b is configured to transmit the second data stream in wireless signals transmitted at 5 GHz;
   controller 122 configures the probe laser 123 and/or coupling laser 125 so as to excite electrons to the second predetermined Rydberg state so that RF detector 120 is configured to detect these wireless signals at 5 GHz; and
   controller 122 configures the processor 129 so that the wireless signals received at the photodetector 127 are demultiplexed into the second data stream.

The time frame structure used in the network 100 may also utilize a guard interval, typically positioned at the beginning of a timeslot where the preceding timeslot is of another set, to enable the controller 122 to reconfigure the probe laser 123, coupling laser 125 and processor 129. Furthermore, this reconfiguration must allow sufficient time for the electrons currently excited to one of the predetermined Rydberg states to decay and for electrons of the first excited state to be excited to the other predetermined Rydberg state. For example, when transitioning from a timeslot of the first set of timeslots (in which the RF detector 120 is configured such that electrons are excited to the first predetermined Rydberg state so as to detect 2.8 GHz wireless signals) to a timeslot of the second set of timeslots (in which the RF detector 120 is configured such that electrons are excited to the second predetermined Rydberg state so as to detect 5 GHz wireless signals), then the guard interval should allow sufficient time for electrons to decay from the first predetermined Rydberg state and for electrons to be excited to the second predetermined Rydberg state. This guard interval may be in the range of 3-5 microseconds.

Figure 3:
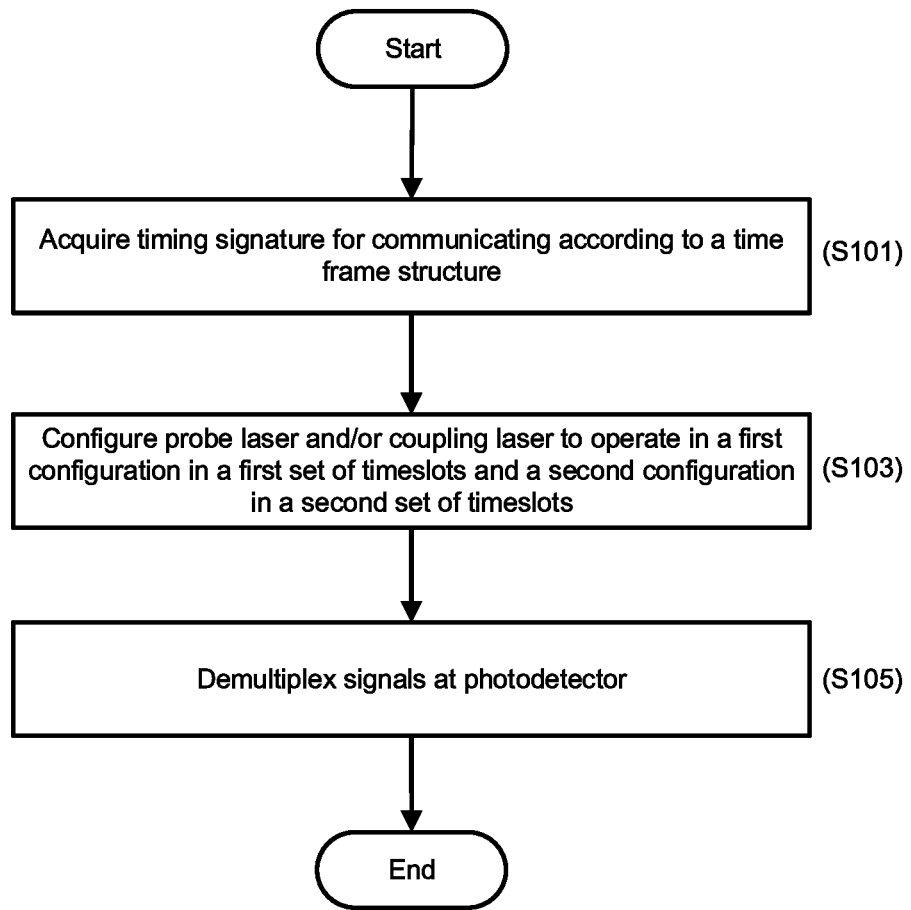
FIG. 3 is a flow diagram of a first embodiment of a method of the present disclosure.

A first embodiment of a method of the present disclosure will now be described with reference to FIG. 3. This first embodiment of a method relates to the first embodiment of the wireless telecommunications network 100 described above and shown in FIG. 2. In this first embodiment, the first wireless transmitter 110a is transmitting wireless signals at 2.8 GHz in a first set of timeslots of a time frame structure and the second wireless transmitter 110b transmits wireless signals at 5 GHz in a second set of timeslots of the time frame structure. Wireless signals from both the first and second wireless transmitter 110a, 110b are incident upon the vapor cell 121 of the RF detector 120.

In S101, the controller 122 acquires a timing signature for communicating according to the time frame structure used by the first and second wireless transmitters 110a, 110b. In S103, the controller 122 configures the probe laser 123 and/or coupling laser 125 to operate in the first configuration (described above, so as to detect wireless signals having a frequency of 2.8 GHz) in each timeslot of the first set of timeslots, and in the second configuration (also described above, so as to detect wireless signals having a frequency of 5 GHz) in each timeslot of the second set of timeslots. In S105, the controller 122 configures the processor 129 to receive and demultiplex signals at the photodetector according to the time frame structure so that a first data stream is demultiplexed as data received during each timeslot of the first set of timeslots and a second data stream is demultiplexed as data received during each timeslot of the second set of timeslots. The first data stream is associated with the first wireless transmitter 110a and the second data stream is associated with the second wireless transmitter 110b. The first and second data streams may then be further processed (locally or by another entity).

This first embodiment of a method and wireless telecommunications network 100 therefore provides a time-division multiplexing technique in communications from a wireless transmitter to an RF receiver that is based on a Rydberg-atom. This allows the photodetector 129 to receive multiple multiplexed data streams in which each data stream is transmitted in a timeslot designated for that data stream.

Furthermore, in the first embodiment, the first data stream is transmitted at a first frequency in a first set of timeslots of a time frame structure and the second data stream is transmitted at a second frequency in a second set of timeslots of the time frame structure. However, this is non-essential as the first and second data streams may be transmitted at the same frequency, so long as they are time-multiplexed such that the first data stream is transmitted in the first set of timeslots and the second data stream is transmitted in the second set of timeslots. In other words, a data stream may be transmitted at the same frequency as all other data streams, the same frequency as a subset of the other data streams, or at a unique frequency (i.e. different to all other frequencies used by all other data streams). Each of these implementations enables a communication system in which an RF receiver having a Rydberg atom demultiplexes a multiplexed data stream.

Figure 4:
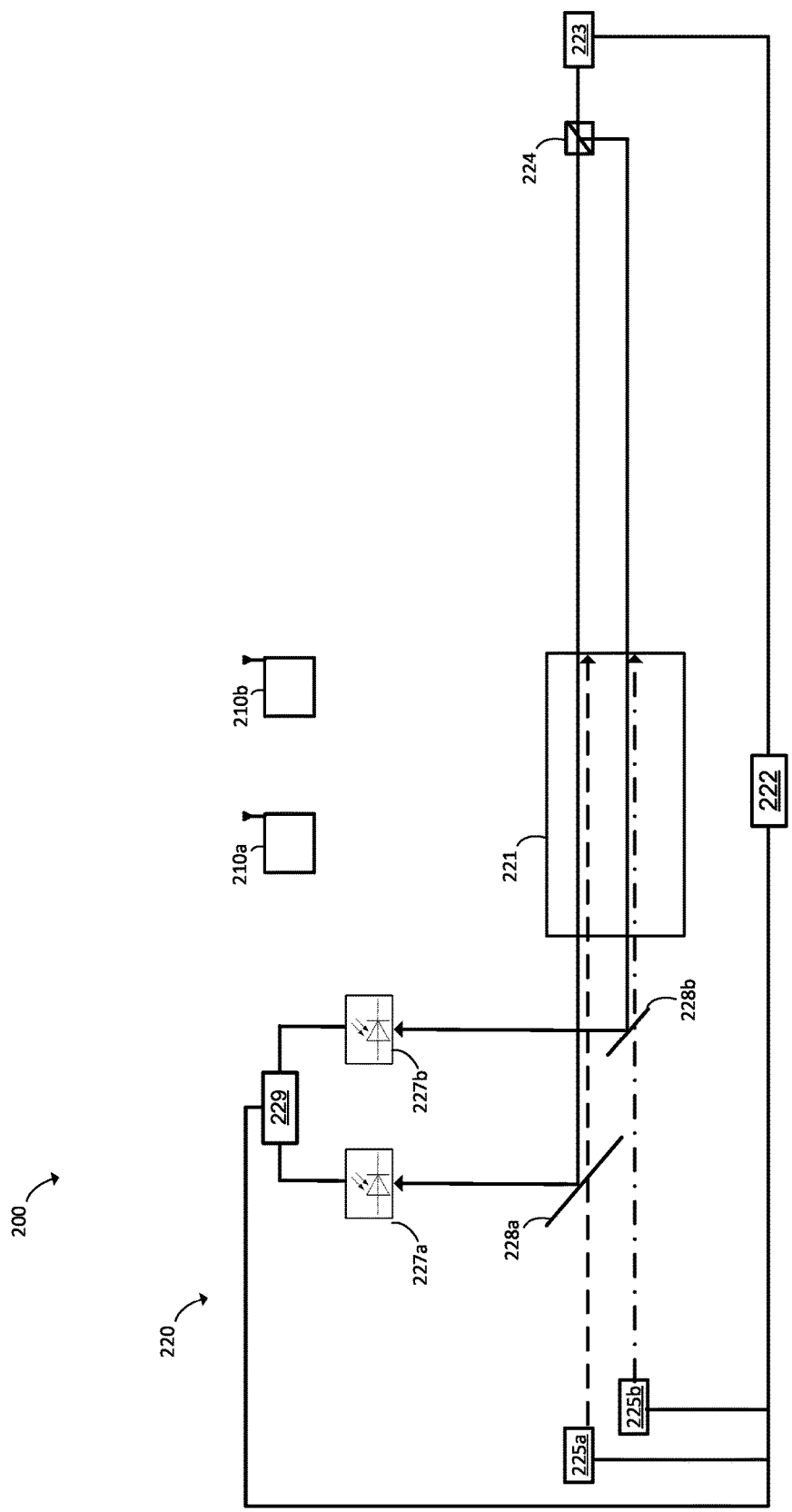
FIG. 4 is a schematic diagram of a second embodiment of a wireless telecommunications network of the present disclosure.

A second embodiment of a wireless telecommunications network 200 will now be described with reference to FIG. 4. The wireless telecommunications network 200 includes a first wireless transmitter 210a, a second wireless transmitter 210b, and a Radio-Frequency (RF) receiver 220. In this embodiment, the first wireless transmitter 210a is configured to transmit wireless signals at a frequency of 2.8 GHz and the second wireless transmitter 210b is configured to transmit wireless signals at a frequency of 5 GHz. The RF receiver 220 is a Rydberg-atom based RF receiver and includes a vapor cell 221, a probe laser 223, a beam splitter 224, a first coupling laser 225a, a second coupling laser 225b, a first photodetector 227a, a second photodetector 227b, a first dichroic mirror 228a and a second dichroic mirror 228b. The RF receiver 220 also includes a processor 229 for processing the received signals of the first and second photodetectors 227a, 227b. The vapor cell 221 contains a vapor of alkali metal (in this embodiment, Rubidium-85). The beam splitter 224 splits a probe signal transmitted by the probe laser 223 into a first path and a second path, discussed below.

The RF receiver 220 also has a controller 222 for controlling a frequency of the probe signal (i.e. to adjust and/or stabilize the frequency of the probe signal), for controlling a frequency of the first coupling signal (i.e. to adjust and/or stabilize the frequency of the first coupling signal), for controlling a frequency of the second coupling signal (i.e. to adjust and/or stabilize the frequency of the second coupling signal), for controlling an intensity of the probe laser 223 (i.e. the transmission power and/or cross-sectional area of the probe laser 223), and for controlling an intensity of the first and second coupling lasers 225a, 225b (i.e. the transmission power and/or cross-sectional area of the first and second coupling lasers 225a, 225b).

The RF receiver 220 may be configured so as to detect a wireless signal incident upon the vapor cell 221. This is achieved by configuring the probe laser 223 of the RF receiver 220 to transmit a probe signal (illustrated by the solid arrowed lines) in a first path through the vapor cell 221 to excite electrons of the Rubidium-85 atoms of the first path of the vapor cell 221, by configuring the probe laser 223 of the RF receiver 220 to transmit a probe signal in a second path to excite electrons of the Rubidium-85 atoms of the second path of the vapor cell 221, by configuring the first coupling laser 225a of the RF receiver 220 to transmit a first coupling signal (illustrated by a dashed arrowed line) along the first path of vapor cell 221 (counter-propagating and overlapping the first path of the probe signal) to excite electrons of the Rubidium-85 atoms of the first path of the vapor cell 221, and by configuring the second coupling laser 225b of the RF receiver 220 to transmit a second coupling signal (illustrated by a dashed single dotted arrowed line) along the second path of vapor cell 221 (counter-propagating and overlapping the second path of the probe signal) to excite electrons of the Rubidium-85 atoms of the second path of the vapor cell 221. The first path of the probe signal is directed towards the first photodetector 227a by the first dichroic mirror 228a and the second path of the probe signal is directed towards the second photodetector 227b by the second dichroic mirror 228b. The frequency of the probe signal is set to correlate with the transition of an electron of a Rubidium-85 atom from a ground state to a first excited state, the frequency of the first coupling signal is set to correlate with the transition of an electron of a Rubidium-85 atom from the first excited state to a first predetermined Rydberg state, and the frequency of the second coupling signal is set to correlate with the transition of an electron of a Rubidium-85 atom from the first excited state to a second predetermined Rydberg state. The first predetermined Rydberg state is selected (based on the specific frequencies of the probe and first coupling signals) so that a wireless signal of a first frequency incident upon the vapor cell 221 excites electrons from the first predetermined Rydberg state to another Rydberg state, causing a detectable change in the EIT signal at the first photodetector 227a. Furthermore, the second predetermined Rydberg state is selected (based on the specific frequencies of the probe and second coupling signals) so that a wireless signal of a second frequency incident upon the vapor cell 221 excites electrons from the second predetermined Rydberg state to another Rydberg state, causing a detectable change in the EIT signal at the second photodetector 227b. The RF receiver 220 of this second embodiment is therefore configured for spatial division multiplexing so as to detect wireless signals of a first frequency at the first photodetector 227a and detect wireless signals of the second frequency at the second photodetector 227b.

In this example, the controller 222 configures the probe laser 223 and/or first coupling laser 225a so that the first path detects wireless signals at a frequency of 2.8 GHz and further configures the probe laser 223 and/or second coupling laser 225b so that the second path detects wireless signals at a frequency of 5 GHz. Thus, in this example, the probe signal and first coupling signal are selected so as to excite electrons to a first predetermined Rydberg state having the $90^{th}$ principal quantum number energy state (i.e. the probe signal has a wavelength of 780 nm and the coupling signal has a wavelength of 479.380 nm) such that wireless signals transmitted by the first wireless transmitter 210a at 2.8 GHz that pass through the first path of the vapor cell 221 will excite electrons from the first predetermined Rydberg state to an adjacent Rydberg state, causing an EIT signal in the monitored probe signal at the first photodetector 227a. Furthermore, in this example, the probe signal and second coupling signal are selected so as to excite electrons to a second predetermined Rydberg state having the $74^{th}$ principal quantum number energy state (i.e. the probe signal has a wavelength of 780 nm and the coupling signal has a wavelength of 479.537 nm) such that wireless signals transmitted by the second wireless transmitter 210b at 5 GHz that pass through the second path of the vapor cell 221 will excite electrons from the second predetermined Rydberg state to an adjacent Rydberg state, causing an EIT signal in the monitored probe signal at the second photodetector 227b.

Figure 5:
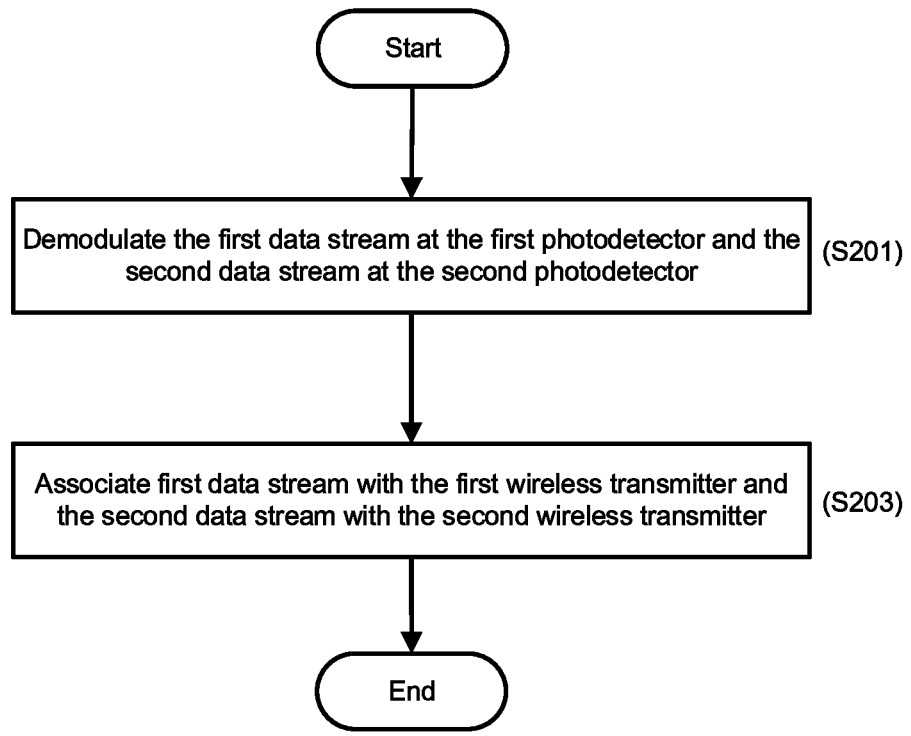
FIG. 5 is a flow diagram of a second embodiment of a method of the present disclosure.

A second embodiment of a method of the present disclosure will now be described with reference to FIG. 5. This second embodiment of a method relates to the second embodiment of the wireless telecommunications network 300 described above and shown in FIG. 4. In this second embodiment, the first wireless transmitter 210a is transmitting wireless signals at 2.8 GHz and the second wireless transmitter 210b transmits wireless signals at 5 GHz. Wireless signals from both the first and second wireless transmitter 210a, 210b are incident upon the vapor cell 221 of the RF detector 220.

In S201 of this second embodiment, the processor 229 receives signals at the first photodetector 227a and demodulates these signals into a first data stream. These signals received at the first photodetector 227a are those transmitted by the first wireless transmitter 210a at 2.8 GHz and incident upon the first path of the vapor cell 221 of the RF detector 220. Furthermore, in S201, the processor 229 receives signals at the second photodetector 227b and demodulates these signals into a second data stream. These signals received at the second photodetector 227b are those transmitted by the second wireless transmitter 210b at 5 GHz and incident upon the second path of the vapor cell 221 of the RF detector 220. In 203, the first data stream is associated with the first wireless transmitter 210a and the second data stream is associated with the second wireless transmitter 210b. The first and second data streams may then be further processed (locally or by another entity).

This second embodiment therefore provides an RF detector having a plurality of paths that may contemporaneously detect wireless signals. In other words, the RF detector of this second embodiment is configured for spatial division multiplexing such that a first wireless signal may be detected at the first photodetector 227a whilst a second wireless signal may be simultaneously detected at the second photodetector 227b. The network 300 of this second embodiment therefore enables multi-carrier communications in which multiple frequencies may be communicated at the same time. The network 200 of this second embodiment therefore also has an increased capacity compared to conventional RF receivers which, at any one time, have a single path configured to receive wireless signals of a single frequency. This additional capacity may be used to increase multiplexing (i.e. such that a greater number of data streams may be communicated) or to increase the data rate for a particular data stream (i.e. such that more timeslots may be designated for the particular data stream).

In the above second embodiment, communications between the first wireless transmitter 210a, second wireless transmitter 210b and RF receiver 220 are configured for communication of a plurality of spatially-multiplexed data streams. This may be enhanced by further multiplexing in the time-domain to enable communication of a plurality of time-and-space multiplexed data streams. For example, the first wireless transmitter 210a and RF receiver 220 may be further configured for time-division multiplexing by communicating according to a first time frame structure in which a first data stream is communicated during a first subset of timeslots of the first time frame structure and a second data stream is communicated during a second subset of timeslots of the first time frame structure. The RF receiver 220 may therefore be configured so that the processor 229 receives and demultiplexes signals at the first photodetector 227a according to the first time frame structure so that a first data stream is demultiplexed as data received during each timeslot of the first set of timeslots of the first time frame structure and a second data stream is demultiplexed as data received during each timeslot of the second set of timeslots of the first time frame structure. Furthermore, the second wireless transmitter 210b and RF receiver 220 may be further configured for time-division multiplexing by communicating according to a second time frame structure in which a third data stream is communicated during a first subset of timeslots of the second time frame structure and a fourth data stream is communicated during a second subset of timeslots of the second time frame structure. The RF receiver 220 may therefore be configured so that the processor 229 receives and demultiplexes signals at the second photodetector 227b according to the second time frame structure so that the third data stream is demultiplexed as data received during each timeslot of the first set of timeslots of the second time frame structure and the fourth data stream is demultiplexed as data received during each timeslot of the second set of timeslots of the second time frame structure. This configuration increases the amount of multiplexing achievable in the network 300.

In a further modification of the above second embodiment, the network 300 may be configured for time-and-space multiplexed communications but using a single frequency. That is, each data stream is communicated at the same frequency. Furthermore, the first and second paths of the vapor cell 221 of the RF detector 220 may be configured to detect that same frequency. In this implementation, the first path of the RF detector 220 is configured to detect a wireless signal during a first subset of timeslots and is not configured to detect a wireless signal during a second subset of timeslots, and the second path of the RF detector 220 is configured to detect a wireless signal during the second subset of timeslots and is not configured to detect a wireless signal during the first subset of timeslots. This may be achieved by directing the coupling signal to the first path only during the first subset of timeslots and directing the coupling signal to the second path only during the second subset of timeslots. In this configuration, each path transitions from a first condition in which there is no excitation by a coupling signal to a second condition in which there is excitation by a coupling signal at the start of its respective subset of timeslots (i.e. the first subset of timeslots for the first path and second subset of timeslots for the second path). By controlling the intensity of the coupling signal such that $\Omega_c^2$ is less than $\Gamma_1\Gamma_2$ (in which $\Omega_c$ is a Rabi frequency of the coupling signal, $\Gamma_1$ is the decay rate of the first excited state of the transmission medium, and $\Gamma_2$ is the decay rate of the predetermined excited state of the transmission medium), and by controlling the detector such that the time difference between the coupling signal being directed along a particular path and subsequently being directed along that same path again is greater than the time for electrons of the Rubidium-85 atoms contained in that path to return to their state under the first condition (e.g. the ground state or a first excited state, depending on the presence of the probe signal during the first condition), then the time for the EIT signal to respond to a change in presence of a wireless signal at the RF receiver is reduced (relative to the scenario in which each path is constantly excited by the coupling signal), such that higher data rate communications are achievable. This advantage is explained in more detail in Applicant's corresponding UK patent application number 2105096.8, the contents of which are hereby incorporated by reference.

In the above second embodiment, a single probe laser produces a probe signal that follows a first and second path (by being split by the beam splitter). This is non-essential and a first and second probe laser may be used instead (for example, where the first path and second path require probe signals at different frequencies). Furthermore, it is non-essential that distinct lasers are used to produce a distinct frequency. That is, a single laser may produce a plurality of laser signals, each at a particular frequency, by using a frequency comb. Furthermore, where a laser is used for each laser signal, only a first signal needs to be tuned and stabilized (using e.g. modulation transfer spectroscopy) at the frequency required for a first laser signal and each other laser may use a laser frequency offset locking technique to produce its respective laser signal. The laser frequency offset locking technique produces a second laser signal by splitting off a portion of the first laser signal and combining this portion with a lower frequency beat signal (that is relatively easy to produce and stabilize). The frequency of the beat signal is equal to the difference between the frequencies of the first laser signal and the second laser signal.

The skilled person will understand that it is non-essential that the atomic medium of the RF detector that may be excited to the predetermined Rydberg states is contained in a vapor cell. That is, the atomic medium may be part of a hollow-core fiber segment of an optical fiber. For example, a hollow core fiber implementation of the first embodiment above may include counter-propagating probe and coupling lasers along an optical fiber with a hollow core segment, and further including a circulator to direct the probe laser towards a photodetector. In another example, a hollow core fiber implementation of the second embodiment above may include counter propagating probe and coupling lasers that are respectively split into a plurality of optical fiber cores (the probe and/or coupling signal of each optical fiber core may be different so as to detect wireless signals of different frequencies, which may be achieved, for example, using a frequency comb) wherein the probe signal of each optical fiber core is directed towards a photodetector using a circulator. The plurality of optical fiber cores may be a plurality of optical fibers each having a single core or may be a plurality of cores of a single fiber. The plurality of optical fiber cores may comprise, for example, 64 cores.

Furthermore, it is non-essential that the atomic medium is comprised of Rubidium-85 atoms. Instead, the atomic medium may be comprised of any other alkali metal, such as Cesium or Strontium.

The skilled person will also understand that the above methods may be applied to many other electromagnetic signals of different frequencies. That is, for a particular target frequency, a system may be configured such that an EIT signal is produced on a probe signal by an incident electromagnetic signal at that target frequency (such as by selecting an appropriate atomic medium (e.g. Rubidium, Cesium or Strontium) having Rydberg states that correspond with that target frequency). Furthermore, it is also non-essential that the EIT signal is produced following a ladder configuration of electron transitions. That is, any configuration (e.g. Lambda, Vee) may be used.

Figure 6:
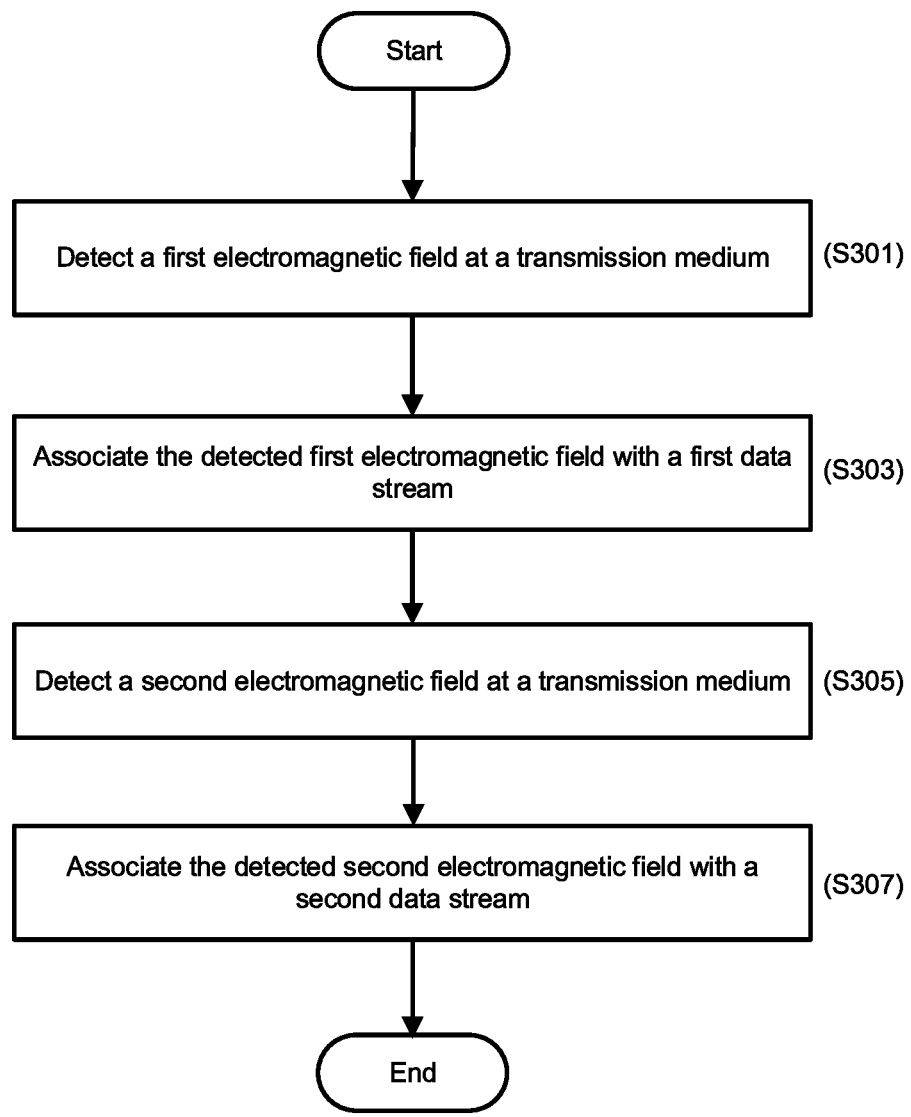
FIG. 6 is a flow diagram of an embodiment of a method of the present disclosure.

FIG. 6 is a flow diagram illustrating an embodiment of the present disclosure. In S301, a first electromagnetic field is detected at the transmission medium. In S303, the detected first electromagnetic field is associated with a first data steam of a plurality of data streams. In S305, a second electromagnetic field is detected at the transmission medium. In S307, the detected second electromagnetic field is associated with a second data steam of the plurality of data streams. Embodiments of the present disclosure therefore provide various forms of multiplexing (e.g. time, space and/or frequency) in order to increase the number of data streams that may be simultaneously received at the detector.

The skilled reader will also understand that it is non-essential for the processor to be part of the same device as the remainder of the RF detector. That is, a signal from the/each photodetector may be transmitted to a remote processor for processing into a plurality of data streams.

The skilled person will understand that any combination of features is possible within the scope of the disclosure, as claimed.

The invention claimed is:

1. A method of receiving a plurality of data streams at an electromagnetic field receiver in a wireless telecommunications network, wherein the electromagnetic field receiver comprises a first optical transmitter, a second optical transmitter, a first transmission medium, a second transmission medium, a first photodetector, and a second photodetector, the first transmission medium and the second transmission medium being spatially distinct, wherein the first optical transmitter is configured to transmit a first probe signal to the first photodetector through the first transmission medium at a first probe frequency and to transmit a second probe signal to the second photodetector through the second transmission medium at a second probe frequency, and the second optical transmitter is configured to transmit a first coupling signal through the first transmission medium at a first coupling frequency and to transmit a second coupling signal through the second transmission medium at a second coupling frequency, wherein the first probe frequency and the first coupling frequency are set to excite electrons of the first transmission medium to a first predetermined Rydberg state so as to induce an Electromagnetic Induced Transparency (EIT) effect in the first transmission medium such that an incident electromagnetic field at a first frequency at the first transmission medium causes a detectable change in the first probe signal at the first photodetector, wherein the second probe frequency and the second coupling frequency are set to excite electrons of the second transmission medium to a second predetermined Rydberg state so as to induce an EIT effect in the second transmission medium such that an electromagnetic field at a second frequency incident at the second transmission medium causes a detectable change in the second probe signal at the second photodetector, wherein the plurality of data streams are time multiplexed in a first time frame comprising a plurality of timeslots, such that a first data stream is communicated in a first subset of the plurality of timeslots of the first time frame and a second data stream is communicated in a second subset of the plurality of timeslots of the first time frame, the method comprising:

obtaining data indicating detection by the first photodetector, in the first probe signal, of a first electromagnetic field incident at the first transmission medium during a timeslot of the first subset of the plurality of timeslots;

associating the detected first electromagnetic field with a first data stream of the plurality of data streams;

obtaining data indicating detection by the second photodetector, in the second probe signal, of a second electromagnetic field incident at the second transmission medium during a timeslot of the second subset of the plurality of timeslots; and associating the detected second electromagnetic field with a second data stream of the plurality of data streams.

2. The method as claimed in claim 1, wherein the first predetermined Rydberg state and the second predetermined Rydberg state are the same.

3. The method as claimed in claim 2, wherein the first probe signal and the first coupling signal are transmitted through the first transmission medium and the second transmission medium in a first condition and a second condition, and wherein:

in the first condition of each of the first transmission medium and the second transmission medium, the first probe signal and the second probe signal, and the first coupling signal and the second coupling signal, are transmitted through the respective first transmission medium and the second transmission medium, the second condition of each of the first transmission medium and the second transmission medium exists for a time period for which an effect of the first coupling signal and the second coupling signal, respectively, on the electrons of the first transmission medium and the second transmission medium, respectively, persists after a switch from the first condition to the second condition, and an intensity of the first coupling signal and the second coupling signal is such that:

$$\Omega_c^2 < \Gamma_1 \Gamma_2$$

in which $\Omega_c$ is a Rabi frequency of the first coupling signal and the second coupling signal, $\Gamma_1$ is a transition rate out of the first excited state of the first transmission medium and the second transmission medium, and $\Gamma_2$ is a transition rate out of the predetermined excited state of the first transmission medium and the second transmission medium.

4. The method as claimed in claim 1, wherein the first predetermined Rydberg state and the second predetermined Rydberg state are different.

5. The method as claimed in claim 4, wherein the plurality of data streams are also time multiplexed in a second time frame comprising a plurality of timeslots, such that a third data stream is communicated in a first subset of the plurality of timeslots of the second time frame and a fourth data stream is communicated in a second subset of the plurality of timeslots of the second time frame, and the method further comprising:

obtaining data indicating detection of a third electromagnetic field incident at the transmission medium during a timeslot of the first subset of the plurality of timeslots of the second time frame;

associating the detected third electromagnetic field with the third data stream of the plurality of data streams;

obtaining data indicating detection of a fourth electromagnetic field incident at the transmission medium during a timeslot of the second subset of the plurality of timeslots of the second time frame; and associating the detected fourth electromagnetic field with the fourth data stream of the plurality of data streams.

6. A computer system comprising at least one processor and memory storing instructions which, when the instructions are executed by the at least one processor, cause the computer system to carry out the method of claim 1.

7. A non-transitory computer readable carrier medium comprising the computer program of claim 6.

8. A method of receiving a plurality of data streams at an electromagnetic field receiver in a wireless telecommunications network, wherein the electromagnetic field receiver comprises a first optical transmitter, a second optical transmitter, a first transmission medium, a second transmission medium, a first photodetector, and a second photodetector, the first transmission medium and the second transmission medium being spatially distinct, wherein the first optical transmitter is configured to transmit a first probe signal to the first photodetector through the first transmission medium at a first probe frequency and to transmit a second probe signal to the second photodetector through the second transmission medium at a second probe frequency, the second optical transmitter is configured to transmit a first coupling signal through the first transmission medium at a first coupling frequency and to transmit a second coupling signal through the second transmission medium at a second coupling frequency, the first probe frequency and the first coupling frequency are set to excite electrons of the first transmission medium to a first predetermined Rydberg state so as to induce an Electromagnetically Inducted Transparency (EIT) effect in the first transmission medium such that an electromagnetic field at a first frequency incident at the first transmission medium causes a detectable change in the first probe signal at the first photodetector, and the second probe frequency and the second coupling frequency are set to excite electrons of the second transmission medium to a second predetermined Rydberg state, different from the first predetermined Rydberg state, so as to induce an EIT effect in the second transmission medium such that an electromagnetic field at a second frequency incident at the second transmission medium causes a detectable change in the second probe signal at the second photodetector, the method comprising:

obtaining data indicating detection by the first photodetector, in the first probe signal, of a first electromagnetic field incident at the first transmission medium;

associating the detected first electromagnetic field with a first data stream of the plurality of data streams;

obtaining data indicating detection by the second photodetector, in the second probe signal, of a second electromagnetic field incident at the second transmission medium; and associating the detected second electromagnetic field with a second data stream of the plurality of data streams.

9. A device for processing a plurality of data streams received at an electromagnetic field receiver in a wireless telecommunications network, the electromagnetic field receiver including a first transmission medium, a second transmission medium being spatially distinct from the first transmission medium, a first photodetector, a second photodetector, a first optical transmitter configured to transmit a first probe signal to the first photodetector through the first transmission medium at a first probe frequency and to transmit a second probe signal to the second photodetector through the second transmission medium at a second probe frequency, and a second optical transmitter configured to transmit a first coupling signal through the first transmission medium at a first coupling frequency and to transmit a second coupling signal through the second transmission medium at a second coupling frequency, wherein the first probe frequency and the first coupling frequency are set to excite electrons of the first transmission medium to a first predetermined Rydberg state so as to induce an Electromagnetic Induced Transparency (EIT) effect in the first transmission medium such that an incident electromagnetic field at a first frequency at the first transmission medium causes a detectable change in the first probe signal at the first photodetector, wherein the second probe frequency and second coupling frequency are set to excite electrons of the second transmission medium to a second predetermined Rydberg state so as to induce an EIT effect in the second transmission medium such that an electromagnetic field at a second frequency incident at the second transmission medium causes a detectable change in the second probe signal at the second photodetector, wherein the plurality of data streams are time multiplexed in a first time frame comprising a plurality of timeslots, such that the first data stream is communicated in a first subset of the plurality of timeslots of the first time frame and the second data stream is communicated in a second subset of the plurality of timeslots of the first time frame, the device comprising:

a processor configured to:
obtain data indicating detection by the first photodetector, in the first probe signal, of a first electromagnetic field incident at the first transmission medium during a timeslot of the first subset of the plurality of timeslots, associate the detected first electromagnetic field with a first data stream of the plurality of data streams, obtain data indicating detection by the second photodetector, in the second probe signal, of a second electromagnetic field incident at the second transmission medium during a timeslot of the second subset of the plurality of timeslots, and associate the detected second electromagnetic field with a second data stream of the plurality of data streams.

10. The device as claimed in claim 9, wherein the first predetermined Rydberg state and the second predetermined Rydberg state are the same.

11. The device as claimed in claim 10, wherein the first probe signal and the first coupling signal are transmitted through the first transmission medium and the second transmission medium in a first condition and a second condition, in which:

in the first condition of each of the first transmission medium and the second transmission medium, the first probe signal and the second probe signal, and the first coupling signal and the second coupling signal, are transmitted through the respective first transmission medium and the second transmission medium, the second condition of each of the first transmission medium and the second transmission medium exists for a time period for which an effect of the first coupling signal and the second coupling signal, respectively, on the electrons of the first transmission medium and the second transmission medium, respectively, persists after a switch from the first condition to the second condition, and an intensity of the first coupling signal and the second coupling signal is such that:

$$\Omega_c^2 < \Gamma_1 \Gamma_2$$

in which $\Omega_c$ is a Rabi frequency of the first coupling signal and the second coupling signal, $\Gamma_1$ is a transition rate out of the first excited state of the first transmission medium and the second transmission medium, and $\Gamma_2$ is a transition rate out of the predetermined excited state of the first transmission medium and the second transmission medium.

12. The device as claimed in claim 9, wherein the first predetermined Rydberg state and the second predetermined Rydberg state are different.

13. The device as claimed in claim 12, wherein the plurality of data streams are also time multiplexed in a second time frame comprising a plurality of timeslots, such that a third data stream is communicated in a first subset of the plurality of timeslots of the second time frame and a fourth data stream is communicated in a second subset of the plurality of timeslots of the second time frame, and detection of a third electromagnetic field incident at the transmission medium is during a timeslot of the first subset of the plurality of timeslots of the second time frame and detection of a fourth electromagnetic field incident at the transmission medium is during a timeslot of the second subset of the plurality of timeslots of the second time frame, and the processor is further configured to:

associate the detected third electromagnetic field with the third data stream of the plurality of data streams; and associate the detected fourth electromagnetic field with the fourth data stream of the plurality of data streams.

14. The device as claimed in claim 9, wherein the device is part of the electromagnetic field receiver.

15. A device for processing a plurality of data streams received at an electromagnetic field receiver in a wireless telecommunications network, the electromagnetic field receiver including a first transmission medium, a second transmission medium being spatially distinct to the first transmission medium, a first photodetector, a second photodetector, a first optical transmitter configured to transmit a first probe signal to the first photodetector through the first transmission medium at a first probe frequency and to transmit a second probe signal to the second photodetector through the second transmission medium at a second probe frequency, and a second optical transmitter configured to transmit a first coupling signal through the first transmission medium at a first coupling frequency and to transmit a second coupling signal through the second transmission medium at a second coupling frequency, wherein the first probe frequency and the first coupling frequency are set to excite electrons of the first transmission medium to a first predetermined Rydberg state so as to induce an Electromagnetically Inducted Transparency (EIT) effect in the first transmission medium such that an electromagnetic field at a first frequency incident at the first transmission medium causes a detectable change in the first probe signal at the first photodetector, and the second probe frequency and second coupling frequency are set to excite electrons of the second transmission medium to a second predetermined Rydberg state, different from the first predetermined excited state, so as to induce an EIT effect in the second transmission medium such that an electromagnetic field at a second frequency incident at the second transmission medium causes a detectable change in the second probe signal at the second photodetector, the device comprising:
   a processor configured to:
      obtain data indicating detection by the first photodetector, in the first probe signal, of a first electromagnetic field incident at the first transmission medium,
      associate the detected first electromagnetic field with a first data stream of the plurality of data streams,
      obtain data indicating detection by the second photodetector, in the second probe signal, of a second electromagnetic field incident at the second transmission medium, and
      associate the detected second electromagnetic field with a second data stream of the plurality of data streams.

* * * * *